US008343877B2

(12) United States Patent
Cheng et al.

(10) Patent No.: US 8,343,877 B2
(45) Date of Patent: Jan. 1, 2013

(54) ANGLE ION IMPLANT TO RE-SHAPE SIDEWALL IMAGE TRANSFER PATTERNS

(75) Inventors: Kangguo Cheng, Albany, NY (US); Bruce B. Doris, Albany, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 12/614,952

(22) Filed: Nov. 9, 2009

(65) Prior Publication Data

US 2011/0111592 A1 May 12, 2011

(51) Int. Cl.
*H01L 21/302* (2006.01)
(52) U.S. Cl. ........... 438/708; 706/709; 706/766; 216/48
(58) Field of Classification Search ................. 438/706, 438/708, 709, 766, 768, 639, 735; 216/41, 216/48, 66
See application file for complete search history.

(56) References Cited

U.S. PATENT DOCUMENTS

| 5,376,566 | A | * | 12/1994 | Gonzalez | 438/253 |
| 5,576,227 | A | * | 11/1996 | Hsu | 438/291 |
| 6,605,506 | B2 | * | 8/2003 | Wu | 438/257 |
| 2003/0230234 | A1 | | 12/2003 | Nam et al. | |
| 2005/0077550 | A1 | | 4/2005 | Inaba et al. | |
| 2005/0142497 | A1 | | 6/2005 | Ryou et al. | |
| 2008/0171408 | A1 | * | 7/2008 | Zhu et al. | 438/157 |
| 2009/0218631 | A1 | | 9/2009 | Zhu et al. | |

OTHER PUBLICATIONS

Patent Cooperation Treaty. International Search Report and Written Opinion for International Patent Application No. PCT/EP2010/062955. Mail Date: Feb. 2011. (9 Pages).
Ommen, A., et al. "Etch Rate Modification of Si3N4 Layers by Ion Bombardment and Annealing" Journal of the Electrochemical Society: Solid-State Science and Technology, vol. 133, No. 10. Oct. 1986. pp. 2140-2147.

\* cited by examiner

*Primary Examiner* — Lan Vinh
(74) *Attorney, Agent, or Firm* — Tutunjian & Bitetto, P.C.; Louis Percello

(57) ABSTRACT

A method for fabrication of features of an integrated circuit and device thereof include patterning a first structure on a surface of a semiconductor device and forming spacers about a periphery of the first structure. An angled ion implantation is applied to the device such that the spacers have protected portions and unprotected portions from the angled ion implantation wherein the unprotected portions have an etch rate greater than an etch rate of the protected portions. The unprotected portions and the first structure are selectively removed with respect to the protected portions. A layer below the protected portions of the spacer is patterned to form integrated circuit features.

18 Claims, 8 Drawing Sheets

ANGLE ION IMPLANT TO RE-SHAPE SIDEWALL IMAGE TRANSFER PATTERNS

BACKGROUND

1. Technical Field

The present invention relates to integrated circuit processing and more particularly to a device and method which employ angle ion implantation to selectively alter an etch rate to re-shape sidewall image transfer patterns.

2. Description of the Related Art

Sidewall Image Transfer (SIT) has been widely used, for example, to form narrow fins for FinFETs (fin field effect transistors). The conventional SIT process requires an additional mask level to remove the undesirable or unwanted parts/sides of the SIT structure. For example, after fin sidewall imaging transfer, the additional mask is used to cut the ends of the fins. Using an extra mask level has drawbacks such as increased mask cost, process cost and process complexity.

Current integration uses SIT to double pattern densities and requires an extra resist mask step to remove the undesirable or un-wanted parts/sides formed by the SIT integration process. Using an extra resist mask step, a few ways exist to etch off the undesirable or un-wanted parts/sides. All of these ways require very high etching selectivity to remove the undesirable or un-wanted parts/sides over a lower layer, to form a final desirable or wanted pattern.

A typical process flow creates a poly silicon mandrel, forms spacers wrapping around the mandrel and uses the spacers as masks to open a lower oxide layer. Remaining spacers are etched off to reduce topography, and a resist mask is processed to expose undesirable parts of oxide masks. Using resist masks, the undesirable parts of the oxide masks are removed. The resist masks are stripped. Then, the oxide masks are employed to etch silicon of a silicon-on-insulator structure to form more densely pitched fin lines.

SUMMARY

A method for fabrication of features of an integrated circuit and device thereof include patterning a first structure on a surface of a semiconductor device and forming spacers about a periphery of the first structure. An angled ion implantation is applied to the device such that the spacers have protected portions and unprotected portions from the angled ion implantation wherein the unprotected portions have an etch rate greater than an etch rate of the protected portions. The unprotected portions and the first structure are selectively removed with respect to the protected portions. A layer below the protected portions of the spacer is patterned to form integrated circuit features.

A method for fabrication of features for an integrated circuit includes patterning one or more mandrel structures on a surface of a semiconductor device; forming sidewall spacers about a periphery of the one or more mandrel structures; applying an angled ion implantation to the device such that the spacers have protected portions and unprotected portions from the angled ion implantation wherein the unprotected portions have an etch rate greater than an etch rate of the protected portions; selectively removing the unprotected portions and the one or more mandrel structures with respect to the protected portions; opening a mask layer disposed below the protected portions of the spacer by etching to expose a layer beneath the mask layer; removing remaining portions of the spacer; forming fins in the layer beneath the mask layer by employing remaining portions of the mask layer as a mask; and forming integrated circuit features using the fins.

Another method for fabrication of features on an integrated circuit includes patterning one or more polysilicon mandrel structures on a surface of a silicon-on-insulator substrate having and mask oxide layer formed thereon; forming nitride sidewall spacers about a periphery of the one or more mandrel structures; applying an angled ion implantation to the spacers, which have protected portions and unprotected portions from the angled ion implantation wherein the unprotected portions have an etch rate greater than an etch rate of the protected portions; selectively removing the unprotected portions and the one or more mandrels with respect to the protected portions; opening the mask oxide layer between the protected portions of the spacer by etching; removing remaining portions of the spacer; forming fins in a silicon layer below the mask oxide layer by employing remaining portions of the mask oxide layer as a mask; and forming field effect transistors using the fins.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
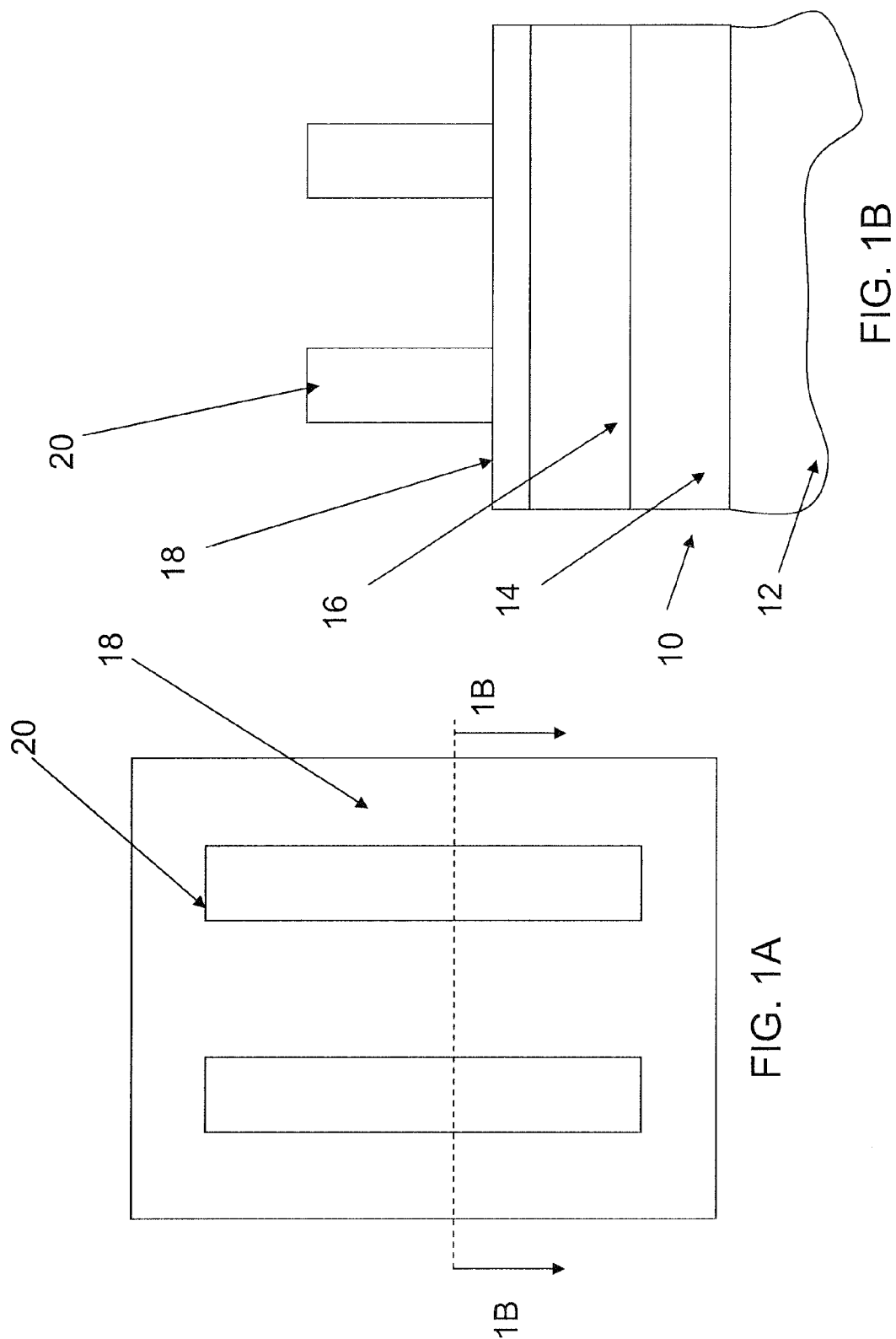
FIG. 1A is a top view of a semiconductor-on-insulator structure having a mask layer and mandrel structures formed thereon.
FIG. 1B is a cross-sectional view taken at section line 1B-1B of FIG. 1A.

The present principles provide a method and device which improves sidewall image transfer in semiconductor fabrication. Using angle ion implantation into undesirable parts of spacers, the selectivity to etching is altered to largely increase the etch rate of the spacers at exposed portions. Next, the implanted part of the spacers is etched selective to the un-implanted part to form desired sidewall image transfer (SIT) patterns. The present embodiments provide many advantages. These include: elimination of a critical resist mask step, angled implantation which is better for controlling line length as compared to alignment uncertainty associated with resist masks, different shapes of structures can be formed without resist masks steps, total process steps are reduced, etc.

It is to be understood that the present invention will be described in terms of a given illustrative architecture having a semiconductor-on-insulator (SOI) wafer; however, other architectures, structures, substrate materials and process features and steps may be varied within the scope of the present invention.

The architecture or device as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1A and 1B, a semiconductor-on-insulator substrate (SOI) 10 is shown having a mask 18 and mandrels 20 formed thereon. The SOI substrate 10 may include a silicon base layer 12 with an oxide layer (BOX layer) 14 and a silicon on oxide layer 16. It should be understood that the substrate 10 may include any suitable material and is not limited to SOI. For example, substrate 10 may include Gallium Arsenide, monocrystalline silicon, Germanium, bulk materials or any other material or combination of materials. In some embodiments, the substrate 10 further comprises other features or structures that are formed on or in the semiconductor substrate in previous process steps.

FIG. 1A shows a top view of mandrels 20. Mandrels 20 are formed on the mask 18 and patterned, preferably using a lithographic process that may include a resist layer (not shown) and lithographic patterning. Mask 18 may be formed by a deposition process and preferably include an oxide, such as silicon dioxide, or a form thereof. Mandrels 20 may be formed from a polysilicon material to form a sacrificial gate structure as shown in FIG. 1B. FIG. 1B is a cross-sectional view taken at section line 1B-1B of FIG. 1A.

Figure 2:
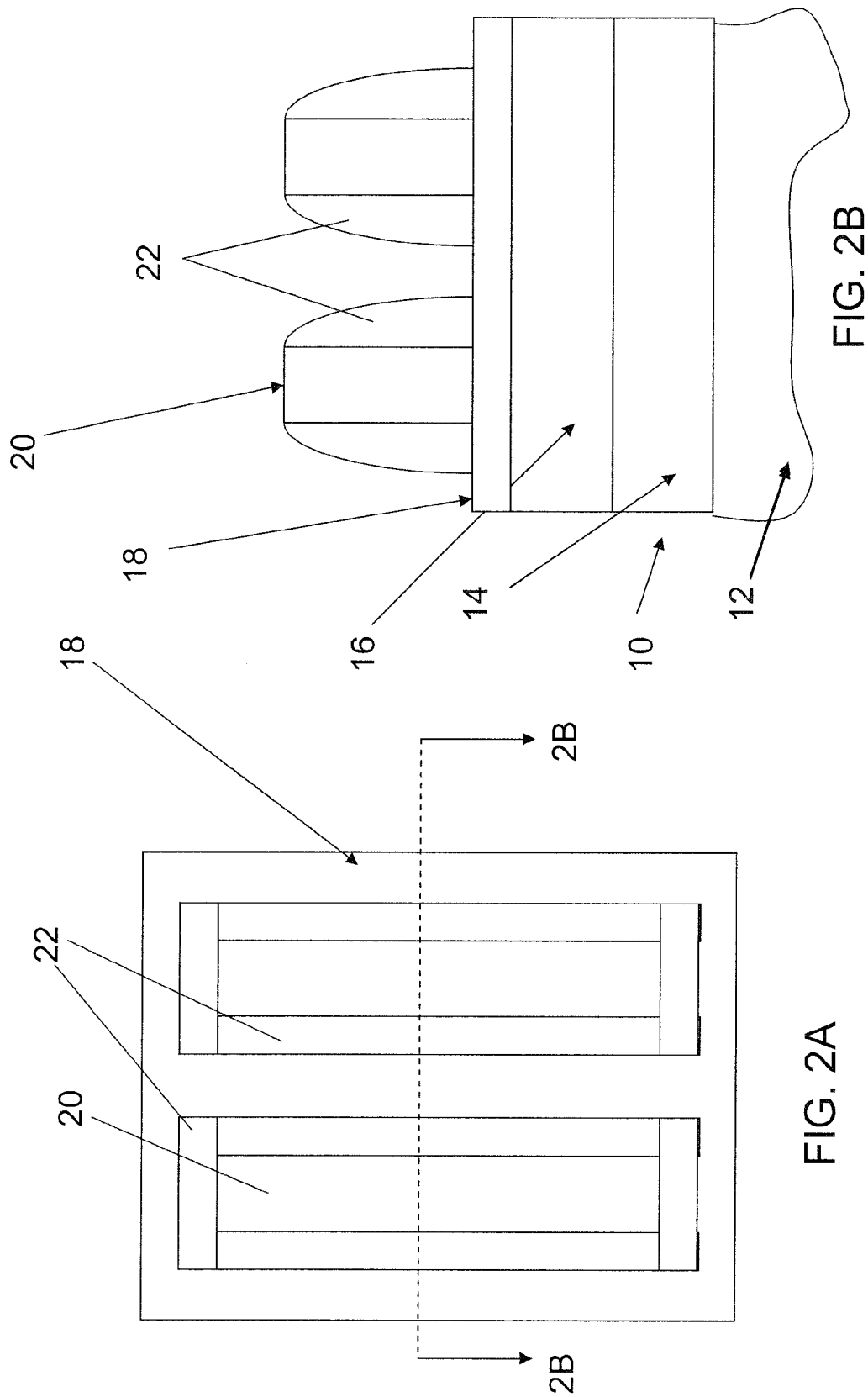
FIG. 2A is a top view of the structure of FIG. 1A having spacers formed about a periphery of the mandrel structures.
FIG. 2B is a cross-sectional view taken at section line 2B-2B of FIG. 2A.

Referring to FIGS. 2A and 2B, the structure of FIGS. 1A and 1B is processed to add a spacer 22 around sidewalls of mandrels 20. The spacer 22 may include a silicon nitride material. The spacer material may be conformally deposited followed by an etch to remove spacer material from a surface of the mask 18. Other materials and process steps may also be employed to arrive at the structure depicted in FIGS. 2A and 2B. FIG. 2A shows a top view of mandrels 20 with spacers 22. FIG. 2B is a cross-sectional view taken at section line 2B-2B of FIG. 2A.

Figure 3:
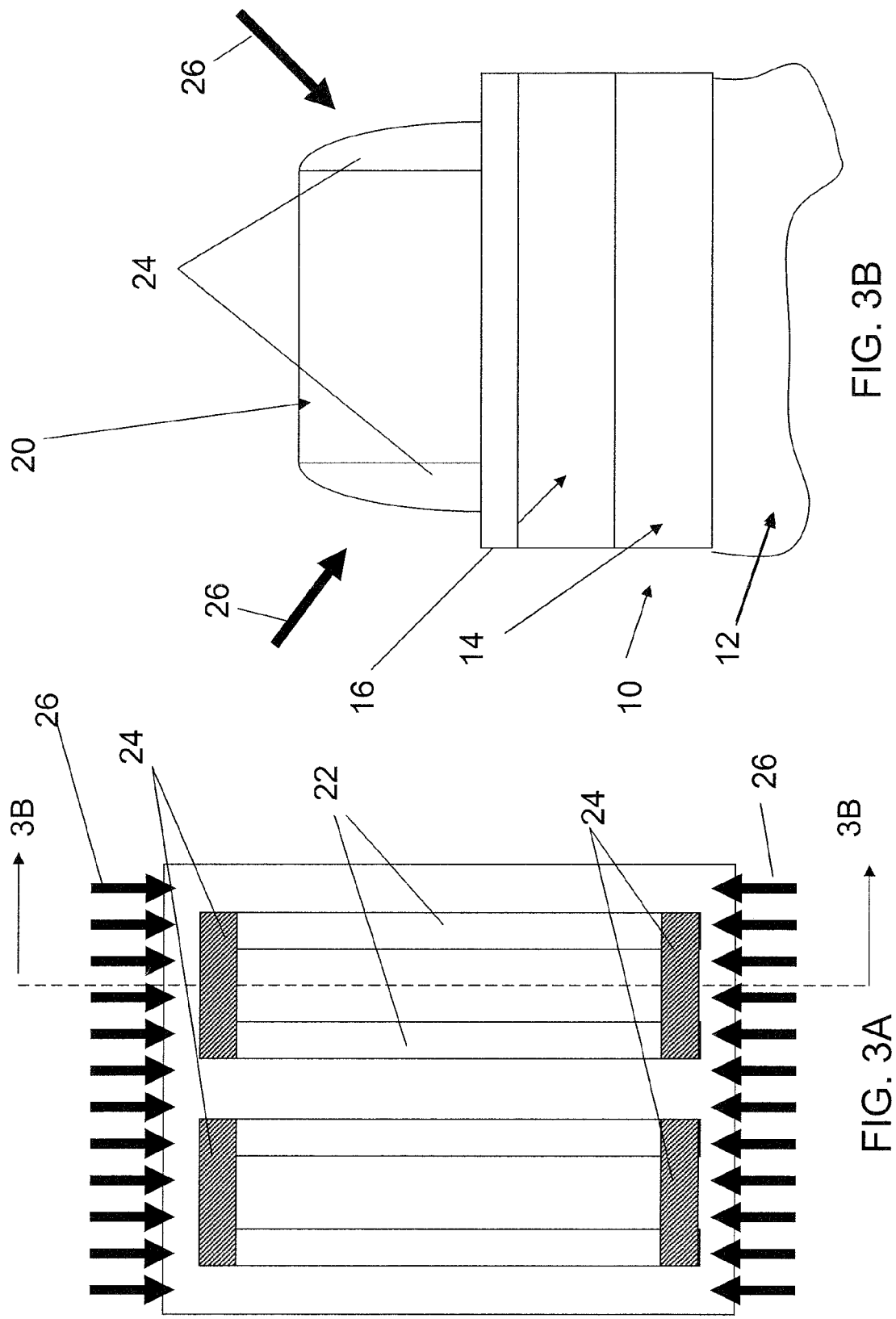
FIG. 3A is a top view of the structure of FIG. 2A having spacers bombarded in selected positions using angled ion implantation.
FIG. 3B is a cross-sectional view taken at section line 3B-3B of FIG. 3A.

Referring to FIGS. 3A and 3B, FIG. 3A shows a top view of mandrels 20 with spacers 22 subject to ion implantation. FIG. 3B is a cross-sectional view taken at section line 3B-3B of FIG. 3A. Using angle ion implantation (I/I) 26 into undesirable portions 24 of the spacers 22, an etch rate of the spacers 22 at these treated portions 24 has its etch rate significantly increased. Angle ion implantation 26 includes bombarding the spacers 22, mandrels 20 and mask 18 with ions, such as, xenon, at angles of approximately 5 degrees to about 75 degrees with respect to a vertical normal to a major surface of the device. Other ion types, include but are not limited to, argon, helium, germanium, silicon, nitrogen, and other angles of attack may also be employed. Depending on spacer thickness and implant species, the implant dose can range from $2 \times 10^{13}/cm^2$ to $2 \times 10^{15}/cm^2$, the implant energy can range from 0.5 KeV to 100 KeV. It should be noted that an angled implantation is employed to be able to select which portions of the spacer 22 are bombarded. Other surfaces are to be protected from the bombardment to ensure that selective surfaces are damaged by the bombardment while other surfaces are not.

Figure 4:
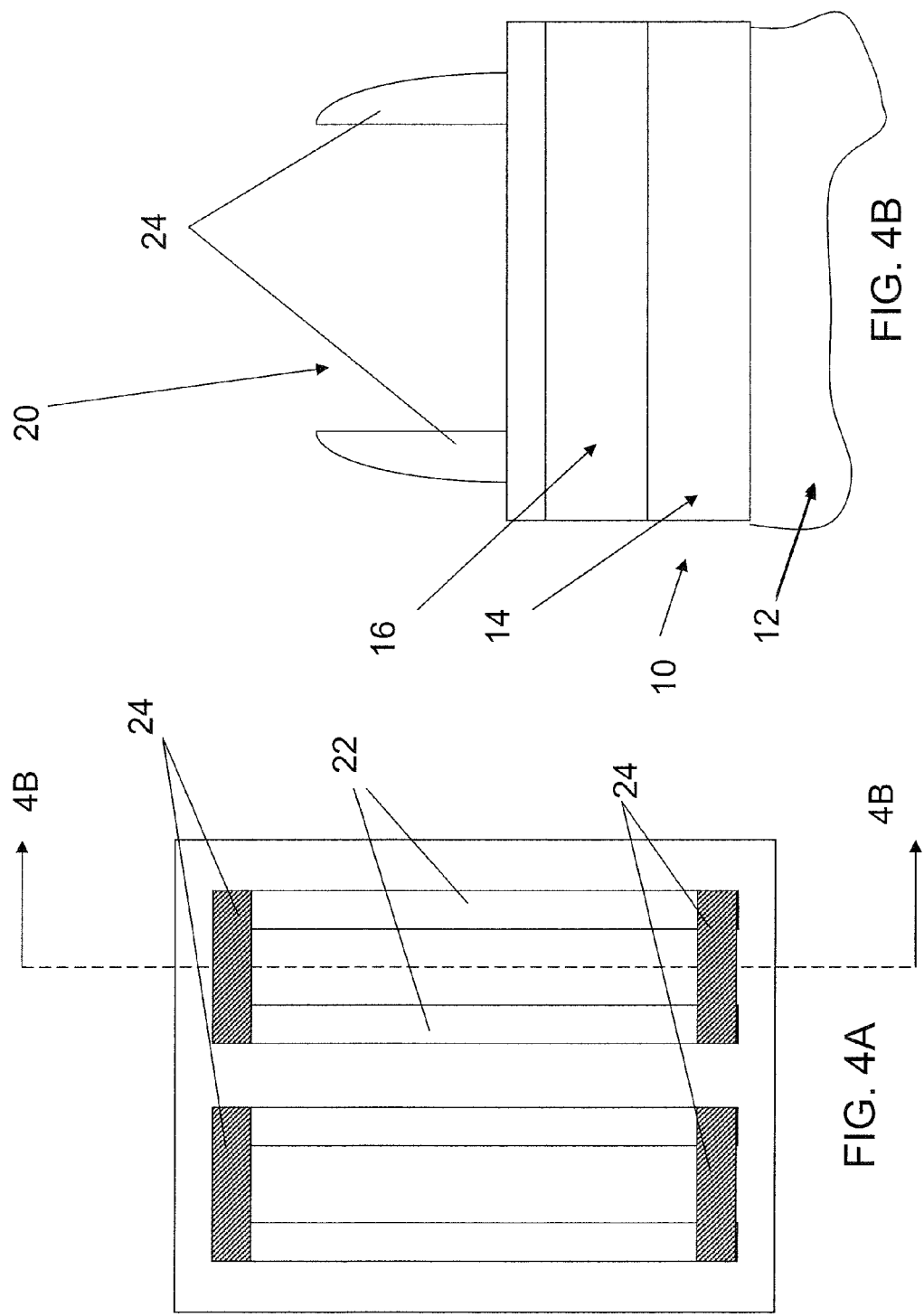
FIG. 4A is a top view of the structure of FIG. 3A having mandrel structures removed.
FIG. 4B is a cross-sectional view taken at section line 4B-4B of FIG. 4A.

Referring to FIGS. 4A and 4B, FIG. 4A shows a top view with mandrels 20 removed leaving spacers 22 having a damaged or treated portions 24 due to ion implantation and undamaged or untreated portions (22). FIG. 4B is a cross-sectional view taken at section line 4B-4B of FIG. 4A. Mandrels 20 are removed selectively with respect to the undamaged spacers 22, damaged portions 26, and mask 18. Etching the mandrels 20 may be performed using a wet etch, dry etch or reactive ion etch. Next, the damaged portions 24 are removed selective to the undamaged spacers 22. Depending on the spacer material, various etch techniques can be employed to remove the damaged portion 24 selective to the undamaged spacers 22. In one embodiment, the spacer material comprises silicon nitride and the implant species is xenon. The implanted portions 24 can be selectively etched with respect to the undamaged spacers 22 by using a wet etch solution containing hydrofluoric acid. The damaged portions 24 can be removed before or after the removal of the mandrels 20.

Figure 5:
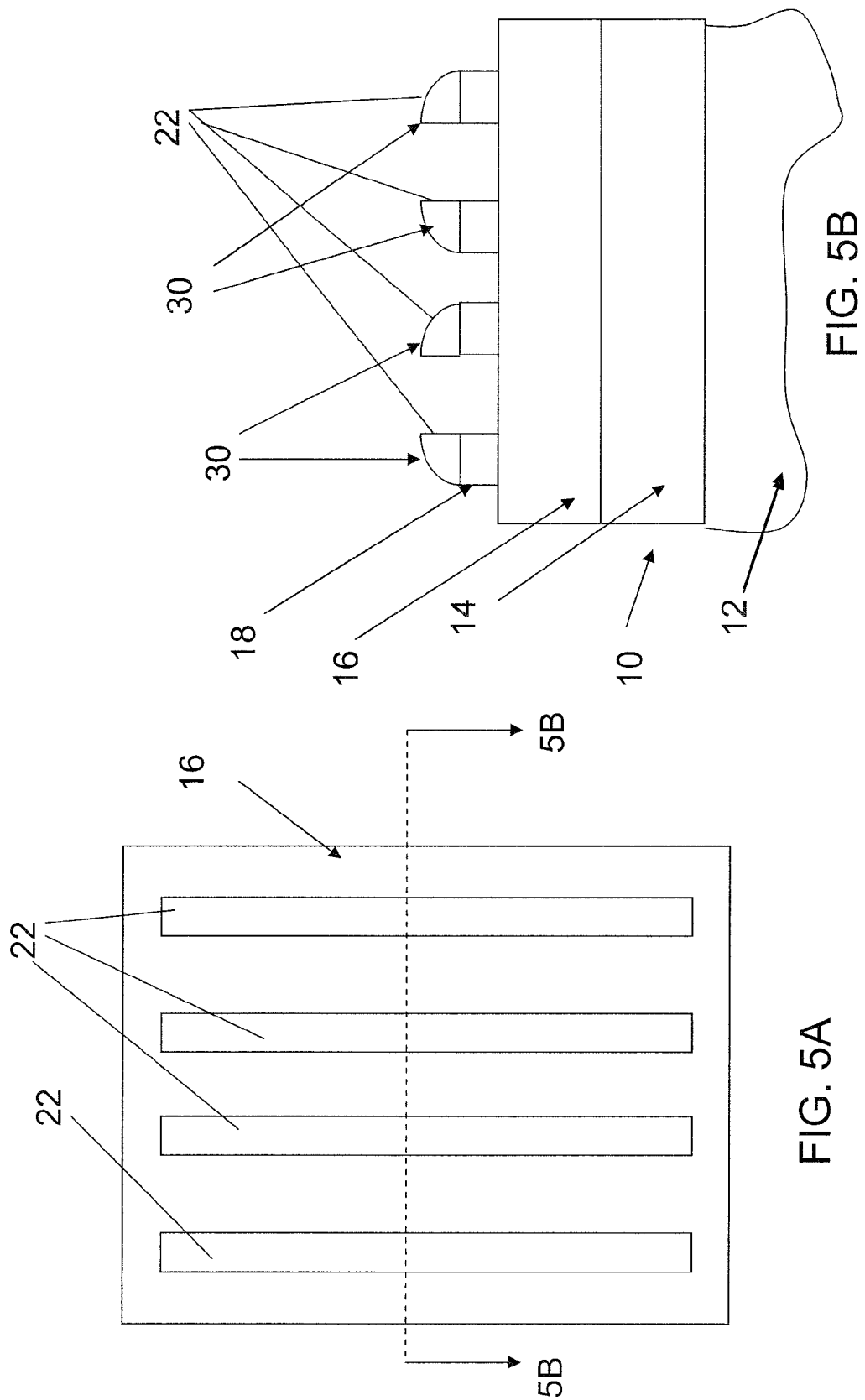
FIG. 5A is a top view of the structure of FIG. 4A having remaining portions of spacers employed as a mask to open a mask layer.
FIG. 5B is a cross-sectional view taken at section line 5B-5B of FIG. 5A.

Referring to FIGS. 5A and 5B, the mask layer 18 is etched while using the undamaged spacers 22 as a mask for a plurality of fin masks 30. The foregoing etching of the hard mask 18 while using the undamaged spacer 22 as a mask may be affected using a known etch method, for example, a wet chemical etch method, a dry plasma etch method, combinations of wet chemical etch methods and dry plasma etch methods, etc. Dry plasma etch methods are particularly desirable insofar as dry plasma etch methods generally provide straight sidewalls to etched layers. The resulting structure is depicted in FIG. 5A (top view) and FIG. 5B (a cross-sectional view taken at section line 5B-5B of FIG. 5A)

Figure 6:
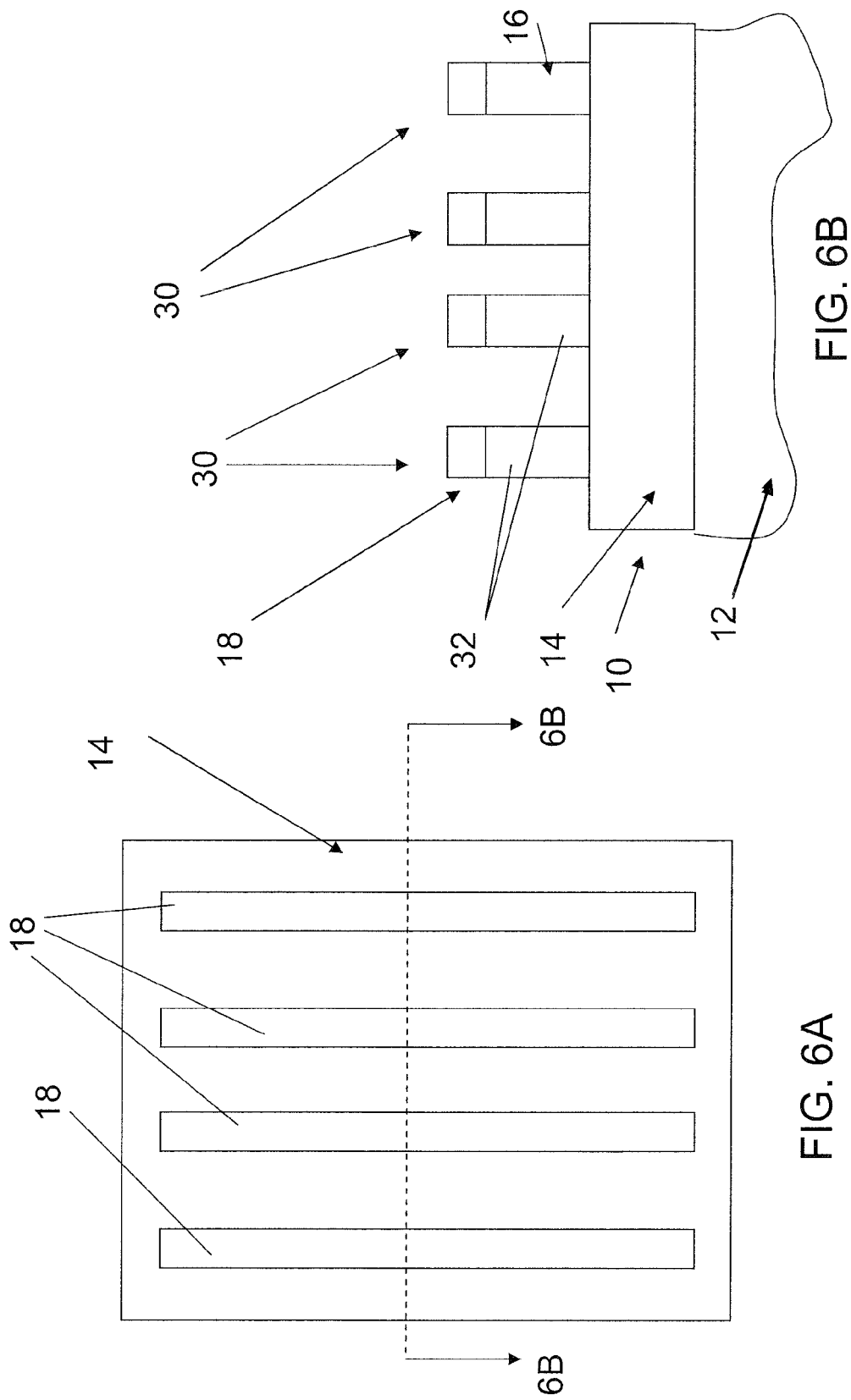
FIG. 6A is a top view of the structure of FIG. 5A having spacers removed to reveal unattacked portions of the mask layer and forming silicon fins.
FIG. 6B is a cross-sectional view taken at section line 6B-6B of FIG. 6A.

Referring to FIGS. 6A and 6B, fin structures 32 are formed. FIG. 6A shows a top view of remaining mask 18 after etching spacers 22. FIG. 6B is a cross-sectional view taken at section line 6B-6B of FIG. 6A. Spacers 22 can be selectively etched to expose a remaining mask 18. In one embodiment, spacers 22 are employed as a mask to etch through layer 18 and through layer 16 to form fins 32. In an alternative embodiment, spacers 22 are removed after etching through layer 18, and mask 18 is employed as an etch mask to etch through layer 16 to form fins 32. Etch processing depends on the materials. In one embodiment, spacers 22 are formed from a nitride, mask 18 is an oxide and layer 14 is an oxide. A reactive ion etch may be employed to form fins 32. Fins 32 provide an etch mask or implantation mask for processing dielectric layer 14 and/or substrate base layer 12 (e.g., silicon) preferably using sub-minimum feature size structures. For example, fins 32 have a thickness sized at, e.g., ½, ¼, ⅛ etc. of the minimum feature size F.

In accordance with the present principles, a resist mask step using critical tolerances is eliminated. Angled ion implantation provides better control of line length compared to alignment uncertainty associated with resist masks. The mask 18 left on the tops of fins 32 is in a pristine or un-attacked state. In addition, different shaped spacer mask structures may be formed without resist masking steps. This reduces the total number of process steps.

Figure 7:
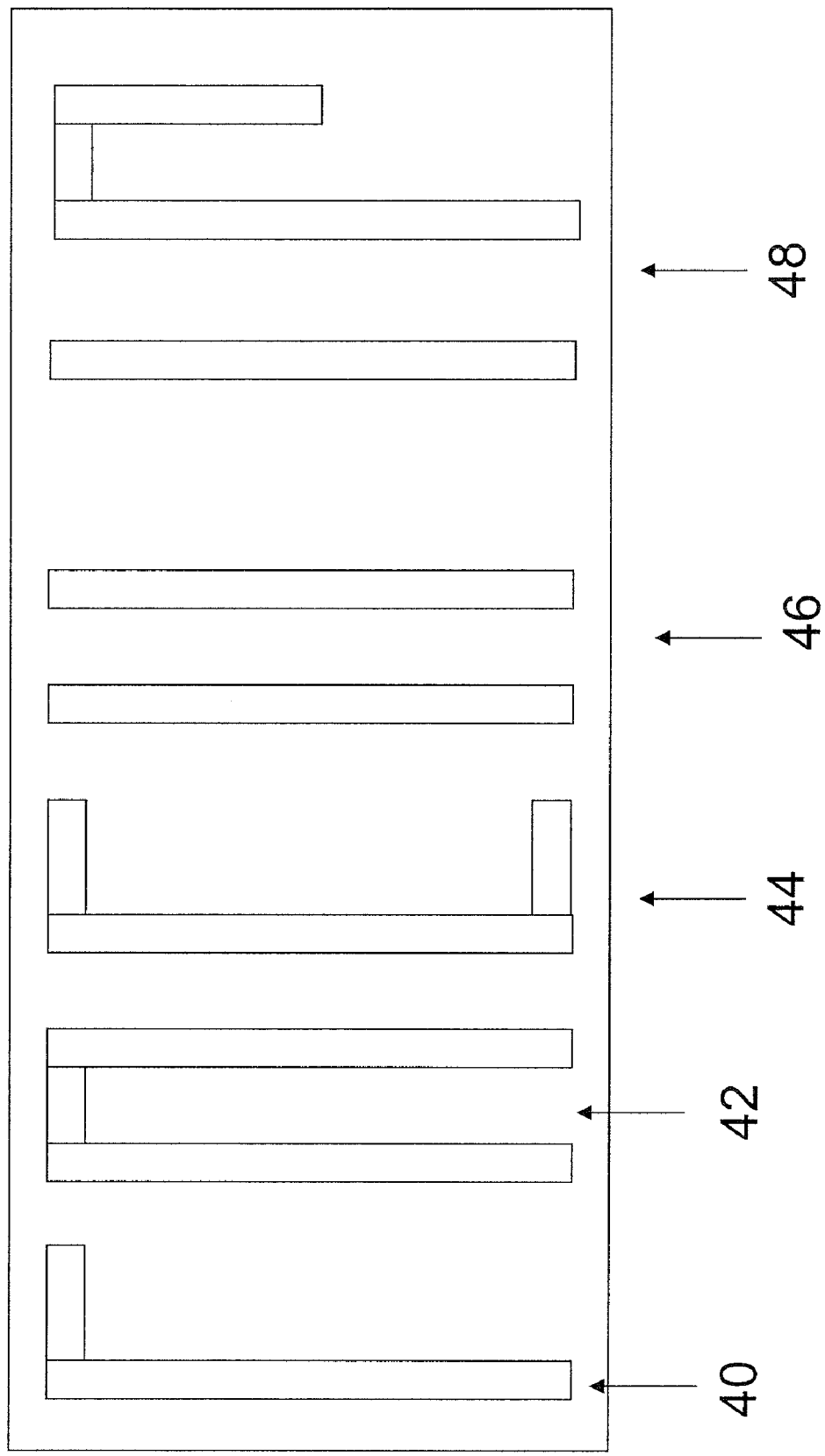
FIG. 7 is a top view of a semiconductor device showing different shaped spacer patterns in accordance with alternative embodiments.

Referring to FIG. 7, a plurality of different shapes is shown to indicate a few possible configurations that may be provided in accordance with the present principles. The shapes may include an "L" shape 40, a "U" shape 42, a "C" shape 44, an "11" shape 46 and a shape 48 having a different pitch or a combination of different shapes. These and other configurations may be combined and provided in accordance with the present principles using a similar process flow as described above. When combining with one or more block masks in shadows of structures, the present process flow provides many different shaped structures that can be fabricated on the same wafer. A block mask may have many features or facets which when subjected to angled ion implantation, form fins with different pitches, sizes lengths, etc. and no critical resist mask is needed.

Figure 8:
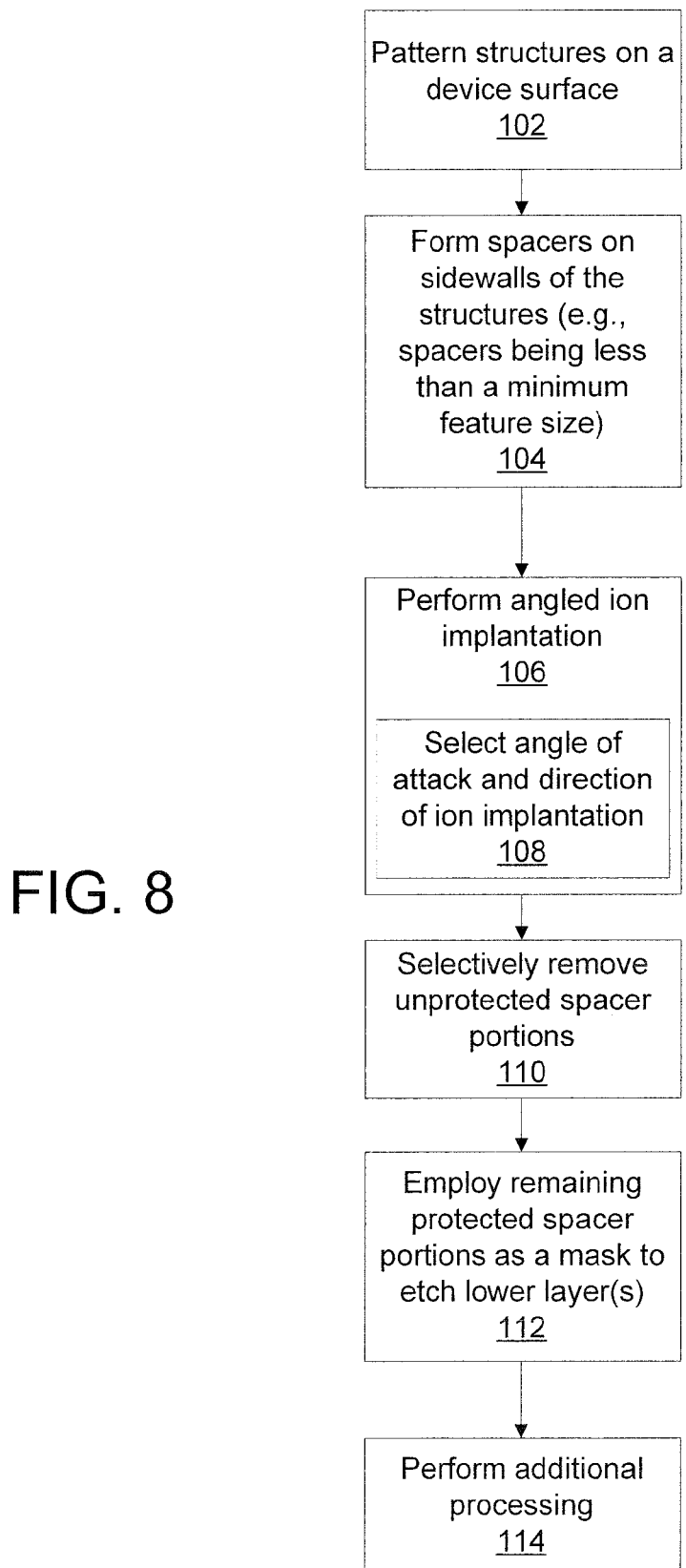
FIG. 8 is a flow diagram showing a method for fabrication of a semiconductor device in accordance with the present principles.

Referring to FIG. 8, a method for fabrication of features in integrated circuits is illustratively depicted in accordance with a preferred embodiment. In block 102, a first structure is patterned on a surface of a semiconductor device. The surface may include a semiconductor structure or further include other features on a semiconductor substrate formed in previous process steps. In one embodiment, the first structure includes at least one mandrel, which may be formed from polysilicon or other suitable material. The mandrels may be patterned using a lithographic method such that a width of the mandrel may include a minimum feature size achievable by the lithographic method.

In block 104, spacers are formed about a periphery of the first structure. The spacers include sidewall spacers and may be formed from a silicon nitride (nitride) or similar material. The spacer is particularly useful in that the space includes a width of less than the minimum feature size. Sub-feature sized devices (below minimum feature size) are therefore provided in accordance with the present principles. In block 106, an angled ion implantation is applied to the device such that the spacers have protected portions and unprotected portions from the angled ion implantation wherein the unprotected portions have an etch rate greater than an etch rate of the protected portions. The angled ion implantation may include selecting an angle of attack and direction of ion implantation to modify a shape of exposed spacers in block 108.

In block 110, the unprotected portions of the spacer and the first structure are selectively removed with respect to the protected portions of the spacer. Since the etch rate of the unprotected portions is greater than the etch rate of the protected portion, the unprotected portions are easily removed selective to the protected portions. In block 112, a layer below the protected portions of the spacer is patterned to form integrated circuit features. These integrated circuit features may include forming fins or other semiconductor structures in the layer below the protected portions of the spacer. The semiconductor device may be a silicon-on-insulator structure, and the fins may be formed in a silicon on oxide layer below the protected portions of the spacer. The fins may be formed through an oxide mask and a silicon on oxide layer below the protected portions of the spacer such that upon removal of the spacers the mask oxide includes material unattacked by prior processing. In block 114, additional processing may include forming field effect transistors, further etching through lower layers, etc.

Having described preferred embodiments for devices and methods for angle ion implant to re-shape sidewall image transfer patterns (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of features for an integrated circuit, comprising:
    patterning a first structure on a surface of a semiconductor device;
    forming spacers about a periphery of the first structure;
    applying an angled ion implantation to the device such that the spacers have protected portions and unprotected portions from the angled ion implantation wherein the unprotected portions have an etch rate greater than an etch rate of the protected portions;
    selectively removing the unprotected portions and the first structure with respect to the protected portions; and
    patterning a layer below the protected portions of the spacer to form integrated circuit features.

2. The method as recited in claim 1, wherein patterning a layer below the protected portions of the spacers to form integrated circuit features includes forming fins in the layer below the protected portions of the spacer.

3. The method as recited in claim 2, wherein the semiconductor device includes a silicon-on-insulator structure and the step of forming fins includes forming fins in a silicon on oxide layer below the protected portions of the spacer.

4. The method as recited in claim 2, wherein forming fins includes forming fins in an oxide mask and a silicon on oxide layer below the protected portions of the spacer such that upon removal of the spacers the mask oxide includes material unattacked by prior processing.

5. The method as recited in claim 1, wherein the applying an angled ion implantation include selecting an angle of attack and direction of ion implantation to modify a shape of exposed spacers.

6. The method as recited in claim 1, wherein the first structure includes a mandrel patterned using a lithographic method such that a width of the mandrel includes a minimum feature size achievable by the lithographic method.

7. The method as recited in claim 6, wherein the spacer includes a width of less than the minimum feature size.

8. A method for fabrication of features for an integrated circuit, comprising:

patterning one or more mandrel structures on a surface of a semiconductor device;

forming sidewall spacers about a periphery of the one or more mandrel structures;

applying an angled ion implantation to the device such that the spacers have protected portions and unprotected portions from the angled ion implantation wherein the unprotected portions have an etch rate greater than an etch rate of the protected portions;

selectively removing the unprotected portions and the one or more mandrel structures with respect to the protected portions;

opening a mask layer disposed below the protected portions of the spacer by etching to expose a layer beneath the mask layer;

removing remaining portions of the spacer;

forming fins in the layer beneath the mask layer by employing remaining portions of the mask layer as a mask; and forming integrated circuit features using the fins.

9. The method as recited in claim 8, wherein the semiconductor device includes a silicon on insulator structure and the step of forming fins includes forming fins in a silicon on oxide layer.

10. The method as recited in claim 8, wherein upon removing remaining portions of the spacer, the mask layer includes material unattacked by prior processing.

11. The method as recited in claim 8, wherein the applying an angled ion implantation includes selecting an angle of attack and direction of ion implantation to modify a shape of exposed spacers.

12. The method as recited in claim 8, wherein the one or more mandrel structures are patterned using a lithographic method such that a width of a mandrel includes a minimum feature size achievable by the lithographic method.

13. The method as recited in claim 12, wherein the spacer includes a width of less than the minimum feature size.

14. A method for fabrication of features on an integrated circuit, comprising:

patterning one or more polysilicon mandrel structures on a surface of a silicon-on-insulator substrate having and mask oxide layer formed thereon;

forming nitride sidewall spacers about a periphery of the one or more mandrel structures;

applying an angled ion implantation to the spacers, which have protected portions and unprotected portions from the angled ion implantation wherein the unprotected portions have an etch rate greater than an etch rate of the protected portions;

selectively removing the unprotected portions and the one or more mandrels with respect to the protected portions;

opening the mask oxide layer between the protected portions of the spacer by etching;

removing remaining portions of the spacer;

forming fins in a silicon layer below the mask oxide layer by employing remaining portions of the mask oxide layer as a mask; and forming field effect transistors using the fins.

15. The method as recited in claim 14, wherein upon removing remaining portions of the spacer, the mask layer includes material unattacked by prior processing.

16. The method as recited in claim 14, wherein the applying an angled ion implantation includes selecting an angle of attack and direction of ion implantation to modify a shape of exposed spacers.

17. The method as recited in claim 14, wherein the one or more mandrel structures are patterned using a lithographic method such that a width of a mandrel includes a minimum feature size achievable by the lithographic method.

18. The method as recited in claim 17, wherein the spacer includes a width of less than the minimum feature size.

* * * * *